US012003255B2

United States Patent
Thiele et al.

(10) Patent No.: US 12,003,255 B2
(45) Date of Patent: Jun. 4, 2024

(54) METHOD AND DEVICE FOR BINARY CODING OF SIGNALS IN ORDER TO IMPLEMENT DIGITAL MAC OPERATIONS WITH DYNAMIC PRECISION

(71) Applicant: COMMISSARIAT A L'ENERGIE ATOMIQUE ET AUX ENERGIES ALTERNATIVES, Paris (FR)

(72) Inventors: Johannes Christian Thiele, Gif sur Yvette (FR); Olivier Bichler, Vieille Eglise en Yvelines (FR); Marc Duranton, Orsay (FR); Vincent Lorrain, Saulx-les-Chartreux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 163 days.

(21) Appl. No.: 17/787,300

(22) PCT Filed: Dec. 10, 2020

(86) PCT No.: PCT/EP2020/085416
§ 371 (c)(1),
(2) Date: Jun. 18, 2022

(87) PCT Pub. No.: WO2021/122260
PCT Pub. Date: Jun. 24, 2021

(65) Prior Publication Data
US 2023/0014185 A1     Jan. 19, 2023

(30) Foreign Application Priority Data
Dec. 18, 2019    (FR) .................................. 1914704

(51) Int. Cl.
*H03M 5/00*      (2006.01)
*G06F 7/544*     (2006.01)
(Continued)

(52) U.S. Cl.
CPC ............ *H03M 7/28* (2013.01); *G06F 7/5443* (2013.01); *G06N 3/02* (2013.01); *G06F 17/18* (2013.01); *G06N 3/063* (2013.01)

(58) Field of Classification Search
CPC ........ H03M 7/28; G06F 7/5443; G06F 17/18; G06N 3/02; G06N 3/063
See application file for complete search history.

(56) References Cited

U.S. PATENT DOCUMENTS

| 9,818,059 B1   | 11/2017 | Woo et al.      |
| 2016/0358069 A1 | 12/2016 | Brothers et al. |

(Continued)

FOREIGN PATENT DOCUMENTS

| EP | 3 343 392 A1   | 7/2018 |
| WO | 2016/050595 A1 | 4/2016 |

*Primary Examiner* — Joseph J Lauture
(74) *Attorney, Agent, or Firm* — BakerHostetler

(57) ABSTRACT

A computer-implemented method for coding a digital signal intended to be processed by a digital computing system includes the steps of: receiving a sample of the digital signal quantized on a number $N_d$ of bits, decomposing the sample into a plurality of binary words of parameterizable bit size $N_p$, coding the sample through a plurality of pairs of values, each pair comprising one of the binary words and an address corresponding to the position of the binary word in the sample, transmitting the pairs of values to an integration unit in order to carry out a MAC operation between the sample and a weighting coefficient.

14 Claims, 4 Drawing Sheets

(51) Int. Cl.
*G06N 3/02* (2006.01)
*H03M 7/28* (2006.01)
*G06F 17/18* (2006.01)
*G06N 3/063* (2023.01)

(56) References Cited

U.S. PATENT DOCUMENTS

2019/0065150 A1 2/2019 Heddes et al.
2021/0192325 A1* 6/2021 Hoang ............... G11C 13/0069

* cited by examiner

METHOD AND DEVICE FOR BINARY CODING OF SIGNALS IN ORDER TO IMPLEMENT DIGITAL MAC OPERATIONS WITH DYNAMIC PRECISION

CROSS-REFERENCE TO RELATED APPLICATIONS

This application is a National Stage of International patent application PCT/EP2020/085416, filed on Dec. 10, 2020, which claims priority to foreign French patent application No. FR 1914704, filed on Dec. 18, 2019, the disclosures of which are incorporated by reference in their entirety.

FIELD OF THE INVENTION

The invention relates to the field of computing architectures for machine learning models, in particular artificial neural networks, and pertains to a method and a device for coding and integrating digital signals with dynamic precision adapted to signals propagated in an artificial neural network.

BACKGROUND

More generally, the invention is applicable to any computing architecture implementing operations of multiply-accumulate (MAC) type.

Artificial neural networks are computational models imitating the operation of biological neural networks. Artificial neural networks comprise neurons that are interconnected by synapses, which are conventionally implemented by digital memories. The synapses may also be implemented by resistive components the conductance of which varies depending on the voltage applied across their terminals. Artificial neural networks are used in various fields of (visual, audio or the like) signal processing, such as, for example, in the field of image classification or image recognition.

A general problem for architectures of computers implementing an artificial neural network relates to the overall energy consumption of the circuit forming the network.

The basic operation implemented by an artificial neuron is a multiply-accumulate (MAC) operation. According to the number of neurons per layer and of layers of neurons that the network comprises, the number of MAC operations per unit of time needed for real-time operation becomes restrictive.

There is therefore a need to develop computing architectures optimized for neural networks that make it possible to limit the number of MAC operations without degrading either the performance of the algorithms implemented by the network or the precision of the computations.

The Applicant's international application WO 2016/050595 describes a signal coding method making it possible to simplify the implementation of the MAC operator.

One drawback of this method is that it does not make it possible to take into account the nature of the signals propagated in the neural network. In particular, when the density of values at 0 in the digital signals propagated in the network is high, needless operations are performed if the coding of the signals does not take this particular feature into account.

SUMMARY OF THE INVENTION

The invention proposes a coding method with dynamic precision that makes it possible to take into account the nature of the signals to be coded, in particular the density of values at 0.

Due to its dynamic aspect, the invention makes it possible to optimize the coding of the signals propagated in a neural network so as to limit the number of MAC operations carried out and thus limit the energy consumption of the circuit forming the network.

One subject of the invention is a computer-implemented method for coding a digital signal intended to be processed by a digital computing system, the method comprising the steps of:

Receiving a sample of the digital signal quantized on a number $N_d$ of bits, Decomposing the sample into a plurality of binary words of parameterizable bit size $N_p$, Coding the sample through a plurality of pairs of values, each pair comprising one of the binary words and an address corresponding to the position of the binary word in the sample, Transmitting the pairs of values to an integration unit in order to carry out a MAC operation between the sample and a weighting coefficient.

According to one particular aspect of the invention, only pairs of values comprising non-zero binary words are transmitted.

According to one particular aspect of the invention, zero binary words are deleted before carrying out the MAC operation.

According to one particular aspect of the invention, one and the same address corresponding to binary words coded from various samples is transmitted only once.

In one variant embodiment, the method according to the invention comprises a step of determining the size $N_p$ of a binary word based on the statistical distribution of the values at 0 of the bits of the digital signal.

According to one particular aspect of the invention, the size $N_p$ of a binary word is parameterized so as to minimize the energy consumption of a digital computing system in which the processed signals are coded by way of said coding method.

According to one particular aspect of the invention, the energy consumption is estimated by simulation or on the basis of an empirical model.

According to one particular aspect of the invention, the digital computing system implements an artificial neural network.

According to one particular aspect of the invention, the size $N_p$ of the binary words is parameterized independently for each layer of the artificial neural network.

Another subject of the invention is a coding device, comprising a coder configured to execute the coding method according to the invention.

Another subject of the invention is an integration device configured to carry out a multiply-accumulate (MAC) operation between a first number coded by way of the coding method according to the invention and a weighting coefficient, the device comprising a multiplier for multiplying the weighting coefficient by the binary word of the first number, a shift register configured to shift the output signal from the multiplier by the value of the address of said binary word, an adder and an accumulation register for accumulating the output signal from the shift register.

Another subject of the invention is an artificial neuron, implemented by a digital computing system, comprising an integration device according to the invention for carrying out a multiply-accumulate (MAC) operation between a received signal and a synaptic coefficient, and a coding device according to the invention for coding the output signal from the integration device, the artificial neuron being configured to propagate the coded signal to another artificial neuron.

Another subject of the invention is an artificial neuron, implemented by a computer, comprising an integration device according to the invention for carrying out a multiply-accumulate (MAC) operation between an error signal received from another artificial neuron and a synaptic coefficient, a local error computing module configured to compute a local error signal on the basis of the output signal from the integration device and a coding device according to the invention for coding the local error signal, the artificial neuron being configured to back-propagate the local error signal to another artificial neuron.

Another subject of the invention is an artificial neural network comprising a plurality of artificial neurons according to the invention.

BRIEF DESCRIPTION OF THE DRAWINGS

Other features and advantages of the present invention will become more clearly apparent upon reading the following description with reference to the following appended drawings.

DETAILED DESCRIPTION

Figure 1:
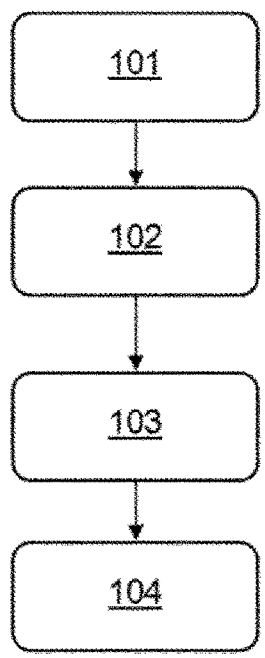
FIG. 1 shows a flowchart illustrating the steps for implementing the coding method according to the invention.

FIG. 1 shows, on a flowchart, the steps for implementing a coding method according to one embodiment of the invention.

One objective of the method is to code a number quantized on Na bits as a group of coded values that are able to be transmitted (or propagated) independently in the form of events.

To this end, the first step 101 of the method consists in receiving a number y quantized on Na bits, Na being an integer. The number y is, typically, a quantized sample of a signal, for example an image signal, an audio signal or a data signal intrinsically comprising a piece of information.

In a second step 102, the number y is decomposed into multiple binary words of respective sizes equal to $N_p$. The number of binary words is equal to $N_d/N_p$, with the constraint that Na mod $N_p$=0, mod denoting the modulo function.

For example, if y=50={00110010}, this number of $N_d$=8 bits may be decomposed into four 2-bit words {00},{11},{00},{10}.

In a third step 103, the number y is coded by a set of pairs of values, each pair comprising one of the non-zero binary words and an address corresponding to the position of the binary word in the number y.

Returning to the previous example, the number y=50 is coded by the pairs (2,{11}) and (0,{10}). The zero binary words {00} are deleted as they do not provide any information and may be omitted if the coded values are signals propagated in a neural network, as will be detailed later.

The number of bits used to code the addresses (or positions) of each binary word is equal to $N_@$=ceil($\log_2(N_d/N_p)$), where ceil( ) denotes the upper integer part function.

In a final step 104, the coded signals are transmitted, for example via a data bus of appropriate size, to a MAC operator with a view to carrying out a multiply-accumulate operation.

In one variant embodiment, the pairs of values associated with the zero binary words are transmitted but are not used when they are received.

In another variant embodiment, when the same address is used for coded values belonging to different samples, this address is transmitted only once. In this case, all binary words having the same address and belonging to various samples are transmitted in a group (either simultaneously or successively) by transmitting the address only once.

Figure 2:
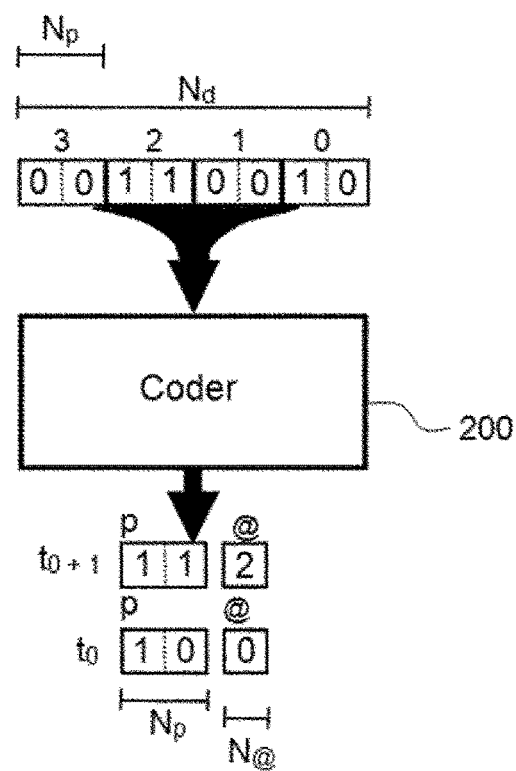
FIG. 2 shows a diagram of a coder according to one embodiment of the invention.

FIG. 2 shows, in schematic form, an exemplary coder 200 configured to code an input value y by applying the method described in FIG. 1. FIG. 2 adopts the non-limiting numerical example for y=50.

The pair of values ({10},0) is transmitted at a time to. The pair of values ({11},2) is transmitted at a following time $t_0$+1. The order of transmission of the values is a parameter of the invention.

One advantage of the proposed coding method is that it makes it possible to limit the size of the transmitted coded data by deleting the values at 0. Another advantage lies in its dynamic aspect, because the parameter $N_p$ is able to be adapted according to the nature of the data to be coded or depending on the constraints on the sizing of the operators used to carry out computations on the coded data.

Figure 3:
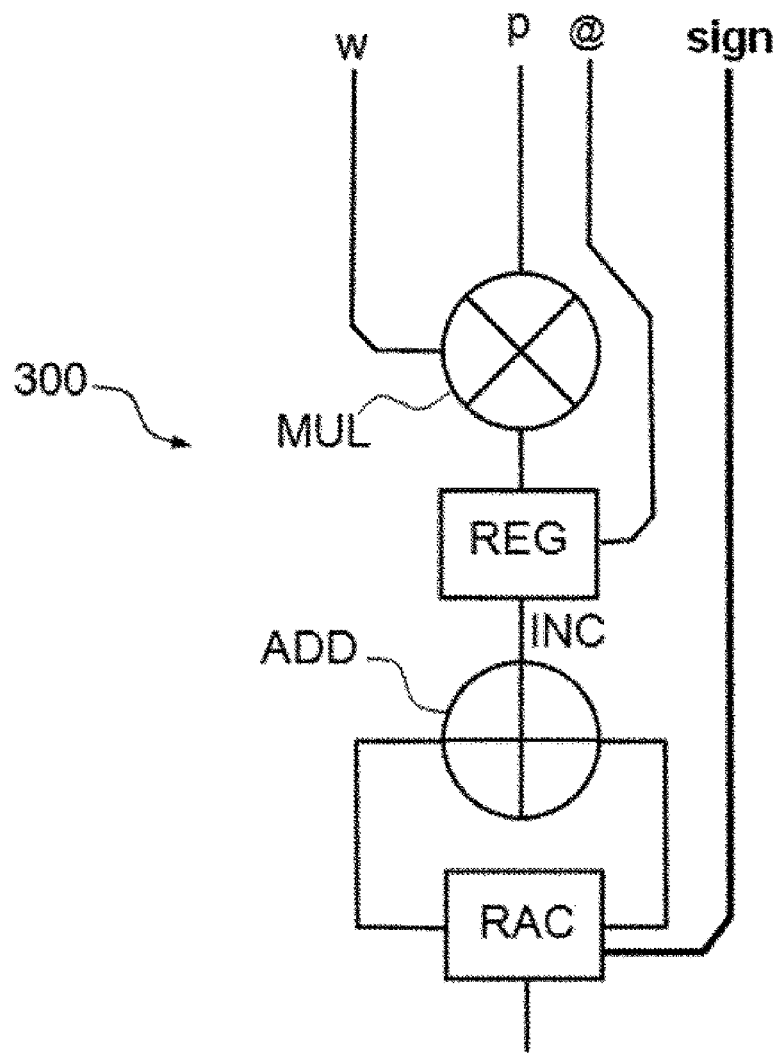
FIG. 3 shows a diagram of an integration module for carrying out an operation of MAC type for numbers quantized via the coding method of FIG. 1.

FIG. 3 schematically shows an integration module 300 configured to carry out an operation of multiply-add type or MAC operation. The integration module 300 described in FIG. 3 is optimized for processing data coded via the method according to the invention. Typically, the integration module 300 implements a MAC operation between an input datum p coded via the coding method according to the invention and a weighting coefficient w that corresponds to a parameter learned by a machine learning model. The coefficient w corresponds, for example, to a synaptic weight in an artificial neural network.

An integration module 300 of the type described in FIG. 3 may be duplicated in order to carry out MAC operations in parallel between multiple input values p and multiple coefficients w.

Alternatively, one and the same integration module may be activated sequentially in order to carry out multiple successive MAC operations.

The integration module 300 comprises a multiplier MUL, a shift register REG, an adder ADD and an accumulation register RAC. When the integration module 300 receives a datum coded in the form (@,p), it takes the product of p and a weighting coefficient w, and then the result at output from the multiplier MUL is shifted to the left by the value of the address @ multiplied by $N_p$. The binary shift operation corresponds to a multiplication of the result by the value $2^{(@ \cdot N_p)}$.

The result INC at output from the shift register REG is then added to the result in memory in the accumulation register RAC.

The value in memory in the register RAC is transmitted and the register RAC is reset to zero when the integration module 300 receives a new datum with an address @ at 0.

The integration module 300 is thus configured to carry out the operation:

$$ACC \leftarrow ACC + w \cdot p \cdot 2^{(@\cdot N_p)}$$

The size of the register RAC must be greater than the sum of the maximum sizes of the values w and p. Typically it will be of the size $N_d + N_w$, which is the maximum size of a MAC operation between words of sizes $N_d$ and $N_w$.

In the particular case where $N_p=1$, p always takes the value 1 or 0. In this case, it is enough to propagate only the address @, the associated value of p necessarily being equal to 1 (since the 0 values are not propagated).

The integration module 300 thus carries out a MAC operation with reduced complexity since the multiplication operation is carried out for numbers of smaller size, in comparison with a conventional implementation.

In the variant embodiment in which all of the binary words belonging to various samples and having the same address are transmitted together, each sample may be integrated in parallel via multiple integration modules of the type described in FIG. 3.

In one variant embodiment, when the numbers are represented in signed notation, a sign management module (not shown in detail in FIG. 3) is also needed.

In another variant embodiment, in order to further limit the number of operations, only some of the most significant bits may be transmitted once the number has been coded.

Returning to the previous example for y=50={00110010}, this number may be coded by the events {2, 11} and then {0, 10}. To further reduce the number of operations, it may be decided to propagate only the first event corresponding to the most significant bits, specifically {2, 11} in this example. This variant is suitable for applications that are less constrained in terms of precision, since it induces greater quantization noise.

Figure 4:
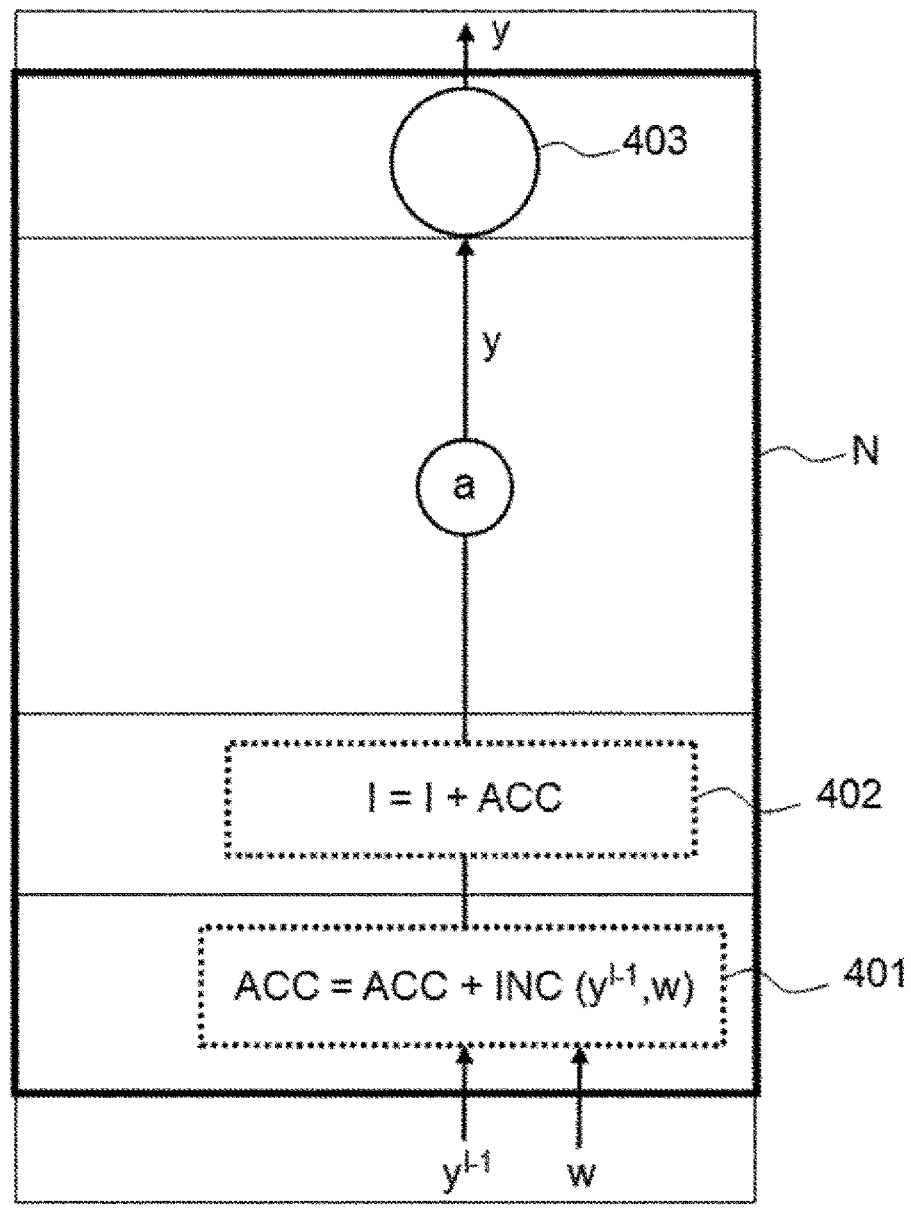
FIG. 4 shows a block diagram of an exemplary artificial neuron comprising an integration module of the type of FIG. 3 for operation during a data propagation phase.
Figure 5:
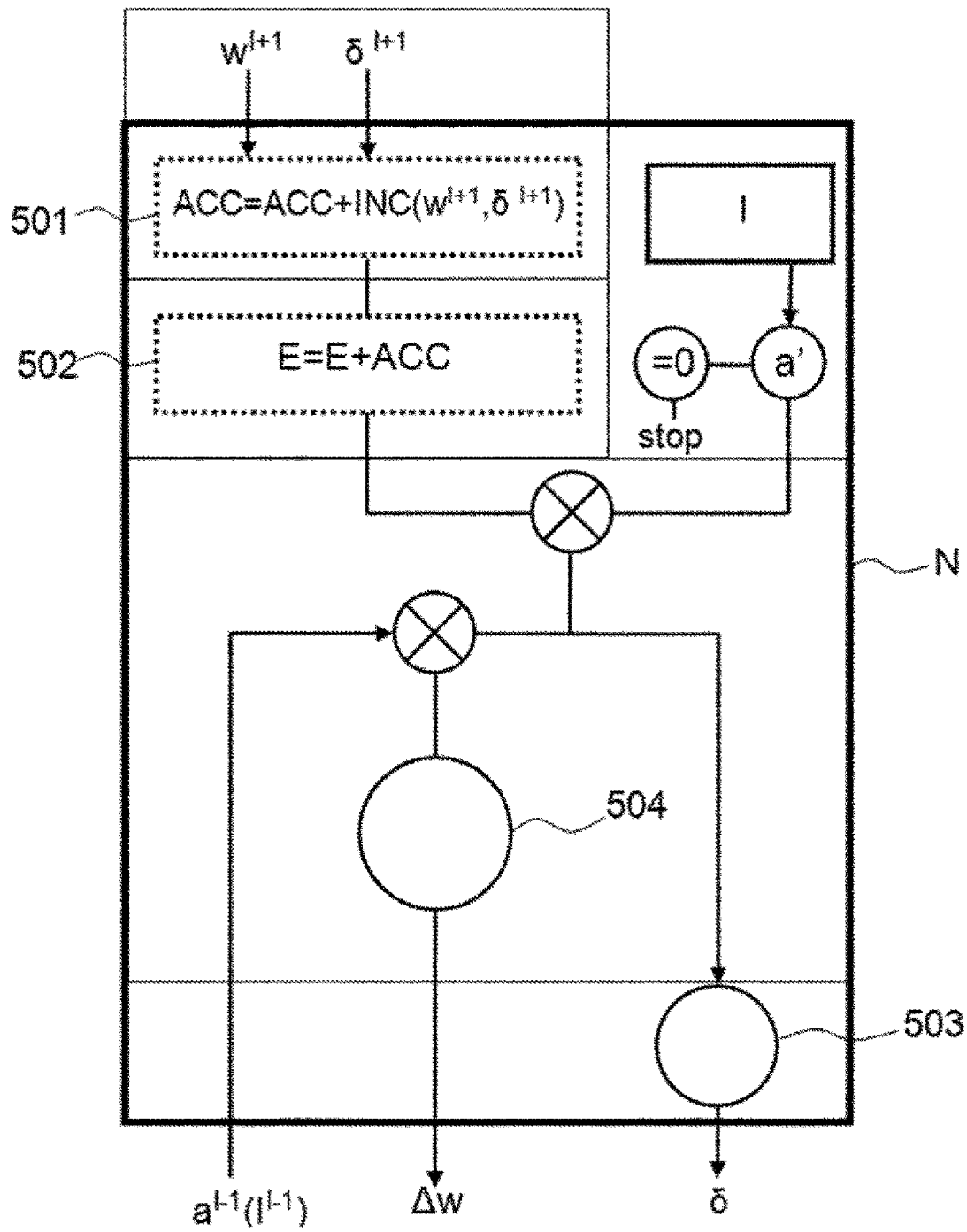
FIG. 5 shows a block diagram of an exemplary artificial neuron comprising an integration module of the type of FIG. 3 for operation during a data back-propagation phase.

The integration module 300 according to the invention may be advantageously used to implement an artificial neural network as illustrated in FIGS. 4 and 5.

FIG. 4 schematically shows a circuit or processor or more generally a computer configured to carry out a machine learning function, for example in the form of an artificial neuron.

Typically, the function implemented by a machine learning model consists of an integration of the signals received at input and weighted by coefficients.

In the particular case of an artificial neural network, the coefficients are called synaptic weights and the weighted sum is followed by the application of an activation function a that, depending on the result of the integration, generates a signal to be propagated at output from the neuron.

Thus, the artificial neuron N comprises a first integration module 401 of the type of FIG. 3 for carrying out the product $y^{l-1} \cdot w$, with $y^{l-1}$ being a value coded via the method according to the invention in the form of multiple events successively propagated between two neurons and w being the value of a synaptic weight. A second conventional integration module 402 is then used to integrate the products $y^{l-1} \cdot w$ over time.

Without departing from the scope of the invention, an artificial neuron N may comprise multiple integration modules for carrying out MAC operations in parallel for multiple input data and weighting coefficients.

The activation function a is, for example, defined by the generation of a signal when the integration of the received signals is completed. The activation signal is then coded via a coder 403 according to the invention (as described in FIG. 2), which codes the value as multiple events that are propagated successively to one or more other neurons.

More generally, the output value of the activation function $a^l$ of a neuron of a layer of index l is given by the following relationship:

[Math. 1]

$$y_i^l = a^l(\Sigma_j y_j^{l-1} w_{ij}^l + b_i^l) = a^l(I_i^l) \tag{1}$$

$I_i^l$ is the output value of the second integration module 402.

$b_i^l$ represents a bias value that is the initial value of the accumulator in the second integration module 402.

$w_{ij}^l$ represents a synaptic coefficient.

The output value $y_i^l$ is then coded via a coder 403 according to the invention (as described in FIG. 2), which codes the value $y_j^l$ as multiple events that are propagated successively to one or more other neurons.

The various operations implemented successively in a neuron N may be carried out at different rates, that is to say with different time scales or clocks. Typically, the first integration device 401 operates at a faster rate than the second integration device 402, which itself operates at a faster rate than the operator carrying out the activation function.

In the case where the two integration devices 401, 402 operate at the same rate, a single integration device is used instead of two. In general, according to the chosen hardware implementation, the number of accumulators used varies.

In a similar way to what was described above, the error signals back-propagated during the back-propagation phase may also be coded by way of the coding method according to the invention. In this case, an integration module according to the invention is implemented in each neuron for carrying out the weighting of the coded error signals received with synaptic coefficients as illustrated in FIG. 5, which shows an artificial neuron configured to process and back-propagate error signals from a layer l+1 to a layer l.

In the back-propagation phase, the error computation $\delta_i^l$ is implemented according to the following equation:

[Math. 2]

$$\delta_i^l = a'^l(I_i^l) E_i^l, \Sigma_i^l = \Sigma_k \delta_k^{l+1} w_{ki}^{l+1} \tag{2}$$

$a'^l(I_i^l)$ is the value of the derivative of the activation function.

The neuron described in FIG. 5 comprises a first integration module 501 of the type of FIG. 3 for carrying out the computation of the product $\delta_k^{l+1} w_{ki}^{l+1}$, with $\delta_k^{l+1}$ being the error signal received from a neuron of the layer l+1 and coded by way of the coding method according to the invention and $w_{ki}^{l+1}$ being the value of a synaptic coefficient.

A second conventional integration module 502 is then used to carry out the integration of the results of the first module 501 over time.

The neuron N comprises other specific operators needed to compute a local error $\delta_i^l$ that is then coded via a coder 503 according to the invention, which codes the error in the form of multiple events that are then back-propagated to the previous layer l−1.

The neuron N also comprises, moreover, a module for updating the synaptic weights 504 depending on the computed local error.

The various operators of the neuron may operate at different rates or time scales. In particular, the first integration module 501 operates at the fastest rate. The second integration module 502 operates at a slower rate than the first module 501. The operators used to compute the local error operate at a slower rate than the second module 502.

In the case where the two integration modules 501, 502 operate at the same rate, a single integration module is used instead of two. In general, according to the chosen hardware implementation, the number of accumulators used varies.

The invention proposes a means for adapting the computing operators of a digital computing architecture depending on the received data. It is particularly advantageous for architectures implementing machine learning models, in which the distribution of the data to be processed varies greatly according to the received inputs.

The invention notably has advantages when the values to be coded are low and/or when they contain many bits at 0. Specifically, zero binary words are not transmitted after coding, thereby making it possible to reduce the number of operations carried out by the machine learning model.

Statistically, only 50% of the bits are zero when random binary data are considered. By contrast, the data propagated within a machine learning model have a large number of low values, this implying a large number of bits at 0 when the values are all represented with the same number of bits.

This property is explained notably by the fact that the data propagated by a machine learning model with multiple processing layers, such as a neural network, convey information that is concentrated, gradually during propagation, toward a small number of neurons. As a result, the values propagated to the other neurons are close to 0 or generally low.

One conventional approach to taking into account this particular property of the signals consists in coding all the values on a low number of bits (for example 8 bits). However, this approach has the drawback of having a large impact for values that exceed the maximum quantization value (for example $2^8-1$). Specifically, these values are clipped at the maximum value, which leads to losses of precision for the values that convey the most information.

This approach is therefore not adapted to these types of machine learning models.

Another approach still consists in coding the values on a fixed number of bits, but while adjusting the dynamic range so as not to clip the maximum values. This second approach has the drawback of modifying the value of data with low values, which are very numerous.

Thus, the coding method according to the invention is particularly adapted to the statistical profile of the values propagated in a machine learning model, because it makes it possible to take into account the whole dynamic range of the values without, however, using a fixed high number of bits to quantize all the values. Thus, there is no loss of precision due to the quantization of the data, but the operators used for the implementation of a MAC operator may be sized to process data of lower size.

One of the advantages of the invention is that the number of binary words and their size $N_p$ are parameters of the coding method.

These parameters, in particular the size $N_p$, may be optimized based on the statistical properties of the data to be coded. This makes it possible to optimize the coding so as to optimize the overall energy consumption of the computer or circuit forming the machine learning model.

Specifically, the coding parameters influence the values that are propagated in the machine learning model and therefore the size of the operators carrying out the MAC operations.

By applying the invention, it is possible to parameterize the coding so as to minimize the number of binary operations carried out or, more generally, to minimize or optimize the resulting energy consumption.

A first approach to optimizing the coding parameters consists in simulating the behavior of a machine learning model for a set of training data and simulating its energy consumption depending on the number and size of the operations carried out. By varying the coding parameters for the same set of data, the parameters that make it possible to minimize energy consumption are sought.

A second approach consists in determining a mathematical model to express the energy consumed by the machine learning model or, more generally, the targeted computer, depending on the coding parameters, in particular $N_p$.

In the case of application of a neural network, the coding parameters may be different according to the layer of the network. Specifically, the statistical properties of the propagated values may depend on the layer of the network. Advancing through the layers, the information tends to be more concentrated toward a few particular neurons. By contrast, in the first layers, the distribution of the information depends on the input data of the neuron; it may be more random.

An exemplary mathematical model for a neural network is proposed below.

The energy $E^l$ consumed by a layer of a network depends on the energy $E_{int}^l(N_p)$ consumed by the integration of an event (a received value) by a neuron and the energy $E_{enc}^{l-1}(N_p)$ consumed by the coding of this event by the previous layer.

Thus, a model of the energy consumed by a layer may be formulated using the following relationship:

[Math. 3]

$$E^l = N_{hist}^{l-1}(N_p^l) \cdot (E_{enc}^{l-1}(N_p^l) + E_{int}^l(N_p^l) \cdot n_{int}^l) \qquad (3)$$

$n_{int}^l$ is the number of neurons in the layer l.

$N_{hist}^{l-1}(N_p^l)$ is the number of events (coded binary words) transmitted by the layer l-1. This number depends on the coding parameter $N_p$ and the distribution of the data.

On the basis of the model given by relationship (3), the value of $N_p$ that makes it possible to minimize the energy $E^l$ consumed is sought for each layer.

The functions $E_{int}^l(N_p^l)$ and $E_{enc}^{l-1}(N_p^l)$ may be determined on the basis of empirical functions or models by way of simulations or on the basis of real measurements.

One advantage of the invention is that it makes it possible to parameterize the value of $N_p^l$ independently for each layer l of the network, which makes it possible to finely take into account the statistical profile of the propagated data for each layer.

The invention may also be applied in order to optimize the coding of error values back-propagated during a gradient back-propagation phase. The coding parameters may be optimized independently for the propagation phase and the back-propagation phase.

In one variant embodiment of the invention, the activation values in the neural network may be constrained so as to favor a wider distribution of low values.

This property may be obtained by acting on the cost function implemented in the final layer of the network. By adding a term to this cost function that depends on the values of the propagated signals, large values in the cost function may be penalized and activations in the network may thus be constrained to lower values.

This property makes it possible to modify the statistical distribution of the activations and thus to improve the efficiency of the coding method.

The coding method according to the invention may be advantageously applied to the coding of data propagated in a computer implementing a machine learning function, for example an artificial neural network function for classifying data according to a learning function.

The coding method according to the invention may also be applied to the input data of the neural network, in other words the data produced at input of the first layer of the network. In this case, the statistical profile of the data is exploited in order to best code the information. For example, in the case of images, the data to be encoded may correspond to pixels of the image or groups of pixels or also to differences between pixels of two consecutive images in a sequence of images (video).

The computer according to the invention may be implemented using hardware and/or software components. The software elements may be available as a computer program product on a computer-readable medium, which medium may be electronic, magnetic, optical or electromagnetic. The hardware elements may be available, in full or in part, notably as application-specific integrated circuits (ASICs) and/or field-programmable gate arrays (FPGAs) and/or as neural circuits according to the invention or as a digital signal processor (DSP) and/or as a graphics processing unit (GPU), and/or as a microcontroller and/or as a general-purpose processor, for example. The computer CONV also comprises one or more memories, which may be registers, shift registers, a RAM memory, a ROM memory or any other type of memory adapted to implementing the invention.

The invention claimed is:

1. A computer-implemented method for coding a digital signal intended to be processed by a digital computing system, the method comprising the steps of:
receiving a sample of the digital signal quantized on a number $N_d$ of bits,
decomposing the sample into a plurality of binary words of parameterizable bit size $N_p$,
coding the sample through a plurality of pairs of values, each pair comprising one of the binary words and an address corresponding to the position of the binary word in the sample,
transmitting the pairs of values to an integration unit in order to carry out a MAC operation between the sample and a weighting coefficient.

2. The coding method as claimed in claim 1, wherein only pairs of values comprising non-zero binary words are transmitted.

3. The coding method as claimed in claim 1, comprising a step of deleting zero binary words before carrying out the MAC operation.

4. The coding method as claimed in claim 1, wherein one and the same address corresponding to binary words coded from various samples is transmitted only once.

5. The coding method as claimed in claim 1, comprising a step of determining the size $N_p$ of a binary word based on the statistical distribution of the values at 0 of the bits of the digital signal.

6. The coding method as claimed in claim 5, wherein the size $N_p$ of a binary word is parameterized so as to minimize the energy consumption of a digital computing system wherein the processed signals are coded by way of said coding method.

7. The coding method as claimed in claim 6, wherein the energy consumption is estimated by simulation or on the basis of an empirical model.

8. The coding method as claimed in claim 1, wherein the digital computing system implements an artificial neural network.

9. The coding method as claimed in claim 8, wherein the size $N_p$ of the binary words is parameterized independently for each layer of the artificial neural network.

10. A coding device comprising a coder configured to execute the coding method as claimed in claim 1.

11. An integration device configured to carry out a multiply-accumulate (MAC) operation between a first number coded by way of the coding method as claimed in claim 1 and a weighting coefficient, the device comprising a multiplier (MUL) for multiplying the weighting coefficient by the binary word of the first number, a shift register (REG) configured to shift the output signal from the multiplier (MUL) by the value of the address of said binary word, an adder (ADD) and an accumulation register (RAC) for accumulating the output signal from the shift register (REG).

12. An artificial neuron (N), implemented by a digital computing system, comprising an integration device as claimed in claim 11 for carrying out a multiply-accumulate (MAC) operation between a received signal and a synaptic coefficient, and a coding device comprising a coder configured to execute the coding method as claimed in claim 11 for coding the output signal from the integration device the artificial neuron (N) being configured to propagate the coded signal to another artificial neuron.

13. An artificial neuron (N), implemented by a computer, comprising an integration device as claimed in claim 11 for carrying out a multiply-accumulate (MAC) operation between an error signal received from another artificial neuron and a synaptic coefficient, a local error computing module configured to compute a local error signal on the basis of the output signal from the integration device and a coding device comprising a coder configured to execute the coding method as claimed in claim 11 for coding the local error signal, the artificial neuron (N) being configured to back-propagate the local error signal to another artificial neuron.

14. An artificial neural network comprising a plurality of artificial neurons as claimed in claim 12.

* * * * *